United States Patent
Ishizuka et al.

(10) Patent No.: US 10,424,484 B2
(45) Date of Patent: Sep. 24, 2019

(54) METHOD FOR MANUFACTURING A BONDED SOI WAFER

(71) Applicant: SHIN-ETSU HANDOTAI CO., LTD., Tokyo (JP)

(72) Inventors: Toru Ishizuka, Takasaki (JP); Norihiro Kobayashi, Takasaki (JP); Masatake Nakano, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/538,240

(22) PCT Filed: Jan. 7, 2016

(86) PCT No.: PCT/JP2016/000051
§ 371 (c)(1),
(2) Date: Jun. 21, 2017

(87) PCT Pub. No.: WO2016/117287
PCT Pub. Date: Jul. 28, 2016

(65) Prior Publication Data
US 2017/0345663 A1    Nov. 30, 2017

(30) Foreign Application Priority Data

Jan. 23, 2015   (JP) ................................ 2015-011487

(51) Int. Cl.
H01L 21/02    (2006.01)
H01L 21/04    (2006.01)
(Continued)

(52) U.S. Cl.
CPC ............ *H01L 21/304* (2013.01); *H01L 21/02* (2013.01); *H01L 21/02008* (2013.01);
(Continued)

(58) Field of Classification Search
None
See application file for complete search history.

(56) References Cited

U.S. PATENT DOCUMENTS 6,376,335 B1 * 4/2002 Zhang ............... H01L 21/02008
                                                          257/E21.214
6,475,072 B1 * 11/2002 Canaperi ............... B24B 37/345
                                                          257/E21.23
(Continued)

FOREIGN PATENT DOCUMENTS

JP    2005-524228 A    8/2005
JP    2007-067179 A    3/2007
(Continued)

OTHER PUBLICATIONS

Aug. 28, 2017 Office Action issued in Taiwanese Patent Application No. 104141982.
(Continued)

*Primary Examiner* — Stephanie P Duclair
(74) *Attorney, Agent, or Firm* — Oliff PLC

(57) ABSTRACT

Method for manufacturing a bonded SOI wafer by bonding a bond wafer and base wafer, each composed of a silicon single crystal, via an insulator film, including the steps: depositing a polycrystalline silicon layer on the base wafer bonding surface side, polishing the polycrystalline silicon layer surface, forming the insulator film on the bonding surface of the bond wafer, bonding the polished surface of the base wafer polycrystalline silicon layer and bond wafer via the insulator film; thinning the bonded bond wafer to form an SOI layer; wherein, in the step of depositing the polycrystalline silicon layer, a wafer having a chemically etched surface as base wafer; chemically etched surface is subjected to primary polishing followed by depositing the polycrystalline silicon layer on surface subjected to the primary polishing, and in the step polishing the polycrystalline silicon layer surface, which is subjected to secondary polishing or secondary and finish polishing.

4 Claims, 2 Drawing Sheets

(51) Int. Cl.
*H01L 21/304* (2006.01)
*H01L 21/321* (2006.01)
*H01L 21/762* (2006.01)
*H01L 27/12* (2006.01)

(52) U.S. Cl.
CPC .. *H01L 21/02013* (2013.01); *H01L 21/02019* (2013.01); *H01L 21/02104* (2013.01); *H01L 21/02107* (2013.01); *H01L 21/02499* (2013.01); *H01L 21/02595* (2013.01); *H01L 21/0445* (2013.01); *H01L 21/76254* (2013.01); *H01L 27/12* (2013.01); *H01L 27/1203* (2013.01); *H01L 21/02024* (2013.01); *H01L 21/3212* (2013.01)

(56) References Cited

U.S. PATENT DOCUMENTS

| | | | | |
|---|---|---|---|---|
| 6,566,267 | B1* | 5/2003 | Wenski | H01L 21/02024 216/91 |
| 2005/0112845 | A1 | 5/2005 | Ghyselen et al. | |
| 2007/0032040 | A1 | 2/2007 | Lederer | |
| 2012/0319121 | A1* | 12/2012 | Reynaud | H01L 21/76254 257/66 |
| 2014/0084290 | A1 | 3/2014 | Allibert et al. | |
| 2015/0017890 | A1 | 1/2015 | Masumura | |

FOREIGN PATENT DOCUMENTS

| | | |
|---|---|---|
| JP | 2007-507093 A | 3/2007 |
| JP | 2010-278160 A | 12/2010 |
| JP | 2013-513234 A | 4/2013 |
| JP | 2013-166200 A | 8/2013 |
| JP | 2014-509087 A | 4/2014 |
| JP | 2014-093457 A | 5/2014 |

OTHER PUBLICATIONS

Apr. 12, 2016 International Search Report issued in Patent Application No. PCT/JP2016/000051.

Mar. 7, 2017 Office Action issued in Japanese Patent Application No. 2015-011487.

Aug. 3, 2017 English Translation of International Preliminary Report on Patentability issued in Patent Application No. PCT/JP2016/000051.

* cited by examiner

METHOD FOR MANUFACTURING A BONDED SOI WAFER

TECHNICAL FIELD

The present invention relates to a method for manufacturing a bonded SOI wafer.

BACKGROUND ART

With developments of portable terminals, internet communication, etc., wireless communication has been receiving more and more increasing demands for the amounts of information and the communication speeds. As radio-frequency devices such as RF switches, miniaturization and integration technology has been increasingly adopted recently to substitute single devices, each of which have been made of a substrate such as an SOS (Silicon On Sapphire) substrate and a GaAs substrate, to a device that integrate these single devices onto an Si substrate. Particularly, methods for manufacturing radio-frequency devices by using SOI wafers have been largely extending a market.

As properties of radio-frequency devices, suppression of second harmonic and third harmonic have been a main requirement to prevent a crossed line of communication. To fulfil this requirement, the substrate have to be an insulator. In SOI wafers, enlargement of a buried oxide film (BOX layer) thickness can be conceived as one of the measure. Oxide films, however, has lower thermal conductivity, and cannot remove the generated heat in operating radio-frequency devices. Accordingly, the use of a higher resistance Si substrate was devised as the support substrate of an SOI wafer. This can suppress electrical conduction under the BOX layer, and can suppress harmonic of the radio-frequency devices. When the SOI layer is electrically charged, however, a depletion layer is generated on the surface of the Si substrate immediately under the BOX layer to form an inversion layer. At this portion, electric conduction is generated to make it impossible to control harmonics. One of the method to solve this problem is to provide a carrier trap layer immediately under the BOX layer (e.g., see Patent Documents 1 to 3).

As the carrier trap layer, polycrystalline silicon layers are most widespread. The polycrystalline silicon layer traps carriers at the grain boundary to suppress electric conduction.

As a method to provide the polycrystalline silicon layer, an SOI wafer provided with a polycrystalline silicon layer can be manufactured by laminating a polycrystalline silicon layer onto a wafer for a support substrate (a base wafer), and then bonding this to a wafer having an oxide film (a bond wafer). In order to realize bonding of wafers in this process, however, the polycrystalline silicon layer surface has to be flat, and it has been devised to perform bonding after removing the surface roughness by polishing.

In manufacturing of a conventional mirror polished silicon single crystal wafer (hereinafter, referred to as a PW) that is used for device production and so on, a silicon single crystal ingot is grown by a Czochralski method, for example. This ingot is processed by slicing off thin disks, and the disk is subjected to various processes such as chamfering, lapping, etching, and polishing to prepare a mirror-plane form wafer (a mirror polished wafer).

In a polishing process of a silicon wafer, the polishing is generally performed through plural stages from rough polishing to finish polishing. For example, primary polishing is performed with a polishing stock removal of about several μm to remove deformation to flatten the wafer surface after a lapping process or an etching process. Subsequently, secondary polishing is performed with a polishing stock removal of about 1 μm to remove scratches formed at the primary polishing and to improve the surface roughness. Furthermore, finish polishing is performed with a polishing stock removal of less than 1 μm to make a haze-free surface. In this way, a wafer surface is mirror polished through rough polishing (primary polishing and secondary polishing) and finish polishing (e.g., see paragraph (0004) in Patent Document 4).

The polishing is performed by setting conditions so as to make the flatness of the polished mirror portion and the surface roughness of the polished mirror portion have smaller values in each stage while moderating the polishing conditions in each and every time of this polishing by changing the size of polishing abrasive grains to be finer and lowering the hardness of the polishing cloth, for example (e.g., see paragraph (0027) in Patent Document 5).

Particularly, a silicon wafer with the diameter of 300 mm is subjected to primary polishing by double-side polishing to satisfy the severe specifications of the flatness, followed by secondary and finish polishing by single-side surface polishing to improve the surface having scratches and the surface roughness (e.g., see paragraph (0002) in Patent Document 6).

CITATION LIST

Patent Literature

Patent Document 1: Japanese Unexamined Patent Application publication (Kohyou) No. 2007-507093
Patent Document 2: Japanese Unexamined Patent Application publication (Kohyou) No. 2013-513234
Patent Document 3: Japanese Unexamined Patent Application publication (Kohyou) No. 2014-509087
Patent Document 4: Japanese Unexamined Patent Application publication (Kokai) No. 2007-067179
Patent Document 5: Japanese Unexamined Patent Application publication (Kokai) No. 2014-093457
Patent Document 6: Japanese Unexamined Patent Application publication (Kokai) No. 2013-166200

SUMMARY OF INVENTION

Problem to be Solved by the Invention

As described above, the substrate for radio-frequency device has come to provide an SOI wafer with a carrier trap layer immediately under the BOX layer. As this carrier trap layer, a polycrystalline silicon layer is most widespread. In order to realize bonding of a base wafer and a bond wafer, the surface of a polycrystalline silicon layer on the base wafer has to be flat, and it has been devised to perform bonding by using polishing to remove the surface roughness of the polycrystalline silicon layer on the base wafer.

When a polycrystalline silicon layer is laminated onto a base wafer, the base wafer does not need to have surface roughness that is necessary for device production (the surface roughness which equals to PW used for manufacturing a device). It is possible to laminate a polycrystalline silicon layer onto a substrate that has surface roughness being equal to that of a chemically etched surface (hereinafter, referred to as a CW surface).

The surface of a polycrystalline silicon layer laminated on a CW surface, however, reflects the surface roughness and undulation of the CW surface. In order to obtain a flat surface that is applicable to bonding, it is necessary to take measures such as setting an extremely large polishing stock removal in polishing after laminating the polycrystalline silicon layer.

On the other hand, even when a polycrystalline silicon layer is laminated on a PW surface, the surface roughness of the polycrystalline silicon layer gets largely worse than the surface roughness of the original PW surface. In order to obtain a flat surface that is applicable to bonding, it is necessary to perform polishing after laminating the polycrystalline silicon layer.

This becomes the same process as polishing to obtain a PW surface, thereby duplicating both polishing steps before and after laminating a polycrystalline silicon layer on a base wafer. This markedly lowers the efficiency of the polishing process (productivity).

The present invention was accomplished in view of the above-described problems. It is an object of the present invention to provide a method for manufacturing a bonded SOI wafer having minimum necessary polishing steps to give a flat polycrystalline silicon surface that can suppress generation of voids when the bonding is completed, after polishing the polycrystalline silicon surface.

Means for Solving Problem

To achieve the above-described object, the present invention provides a method for manufacturing a bonded SOI wafer by bonding a bond wafer and a base wafer, each composed of a silicon single crystal, via an insulator film, comprising the steps of:

depositing a polycrystalline silicon layer on the bonding surface side of the base wafer, polishing a surface of the polycrystalline silicon layer, forming the insulator film on the bonding surface of the bond wafer, bonding the polished surface of the polycrystalline silicon layer of the base wafer and the bond wafer via the insulator film, and thinning the bonded bond wafer to form an SOI layer; wherein, in the step of depositing the polycrystalline silicon layer, a wafer having a chemically etched surface is used as the base wafer, and the chemically etched surface is subjected to primary polishing followed by depositing the polycrystalline silicon layer on the surface subjected to the primary polishing, and in the step of polishing the surface of the polycrystalline silicon layer, the surface of the polycrystalline silicon layer is subjected to secondary polishing or secondary and finish polishing.

In this way, the polishing process in manufacturing a bonded SOI wafer can be a process having minimum necessary polishing steps to give a flat polycrystalline silicon surface that can suppress generation of voids when the bonding is completed, after polishing the polycrystalline silicon surface by performing primary polishing of the chemically etched surface, followed by depositing the polycrystalline silicon layer on the surface subjected to the primary polishing without performing secondary polishing and finish polishing in the step of depositing a polycrystalline silicon layer, and by performing secondary polishing or secondary and finish polishing of the polycrystalline silicon layer surface without performing primary polishing in the polishing step of the polycrystalline silicon layer surface.

As the base wafer, it is preferable to use a base wafer having a resistivity of 100 Ω·cm or more.

By using such a base wafer, it is possible to manufacture an SOI wafer that is suitable as a substrate for a radio-frequency device.

The primary polishing is preferably performed by double-side polishing.

As the primary polishing of the base wafer before growing the polycrystalline silicon layer, double-side polishing can be suitably used.

Effect of Invention

As described above, the inventive method for manufacturing a bonded SOI wafer can make a polishing process in manufacturing a bonded SOI wafer be a process having minimum necessary polishing steps to give a flat polycrystalline silicon surface that can suppress generation of voids when the bonding is completed, after polishing the polycrystalline silicon surface. Accordingly, it is possible to obtain a high quality bonded SOI wafer in high productivity at low cost.

DESCRIPTION OF EMBODIMENTS

Hereinafter, the present invention will be specifically described by reference to FIGS. as an example of the embodiments, but the present invention is not limited thereto.

As described above, the substrate for radio-frequency device has come to provide a polycrystalline silicon layer as a carrier trap layer immediately under the BOX layer of the SOI wafer. In order to realize bonding of a base wafer and a bond wafer in manufacturing such an SOI wafer, the surface of the polycrystalline silicon layer on the base wafer has to be flat, and it has been devised to perform bonding by using polishing to remove the surface roughness of the polycrystalline silicon layer on the base wafer.

In the polycrystalline layer formed on the CW surface of a base wafer, however, it is necessary to take measures such as setting an extremely large polishing stock removal in polishing after laminating the polycrystalline silicon layer in order to obtain a flat surface that is applicable to bonding. On the other hand, even when a polycrystalline silicon layer is laminated on a PW surface, the surface roughness of the polycrystalline silicon layer gets largely worse than the surface roughness of the original PW surface. In order to obtain a flat surface that is applicable to bonding, it is necessary to perform polishing after laminating the polycrystalline silicon layer.

This becomes the same process as polishing to obtain a PW surface, thereby duplicating both polishing steps before and after laminating a polycrystalline silicon layer. This markedly lowers the efficiency of a polishing process.

Accordingly, the present inventors have diligently studied on the method for manufacturing a bonded SOI wafer that can make the polishing process in manufacturing a bonded SOI wafer be a process having minimum necessary polishing steps to give a flat polycrystalline silicon surface that can suppress generation of voids when the bonding is completed, after polishing the polycrystalline silicon surface.

As a result, the present inventors have found that the polishing process in manufacturing a bonded SOI wafer can be a process having minimum necessary polishing steps to give a flat polycrystalline silicon surface that can suppress generation of voids when the bonding is completed, after polishing the polycrystalline silicon surface by performing primary polishing of the chemically etched surface, followed by depositing the polycrystalline silicon layer on the surface subjected to the primary polishing in the step of depositing a polycrystalline silicon layer, and by performing secondary polishing or secondary and finish polishing of the polycrystalline silicon layer surface in the polishing step of the polycrystalline silicon layer surface; thereby bringing the present invention to completion.

Hereinafter, the inventive method for manufacturing a bonded SOI wafer will be described by reference to FIGS. 1 to 2.

Figure 1:
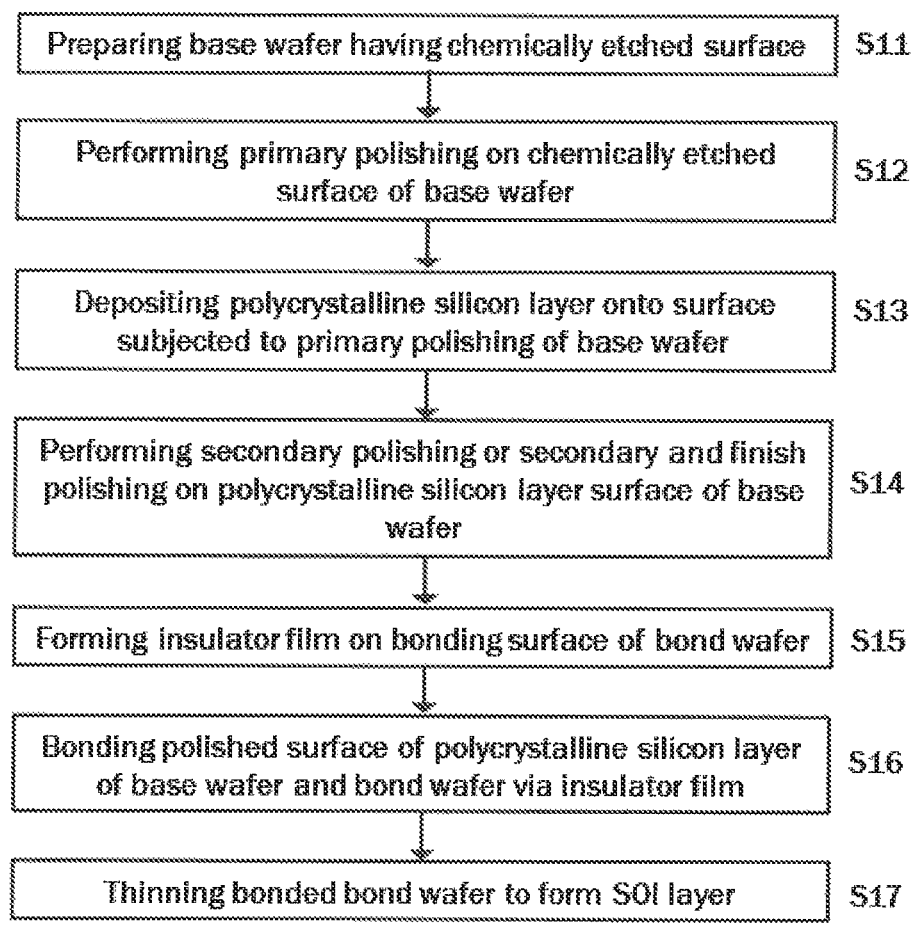
FIG. 1 is a flow diagram showing the inventive method for manufacturing a bonded SOI wafer.

First, a base wafer having a chemically etched surface is prepared (see Step S11 in FIG. 1).

Figure 2:
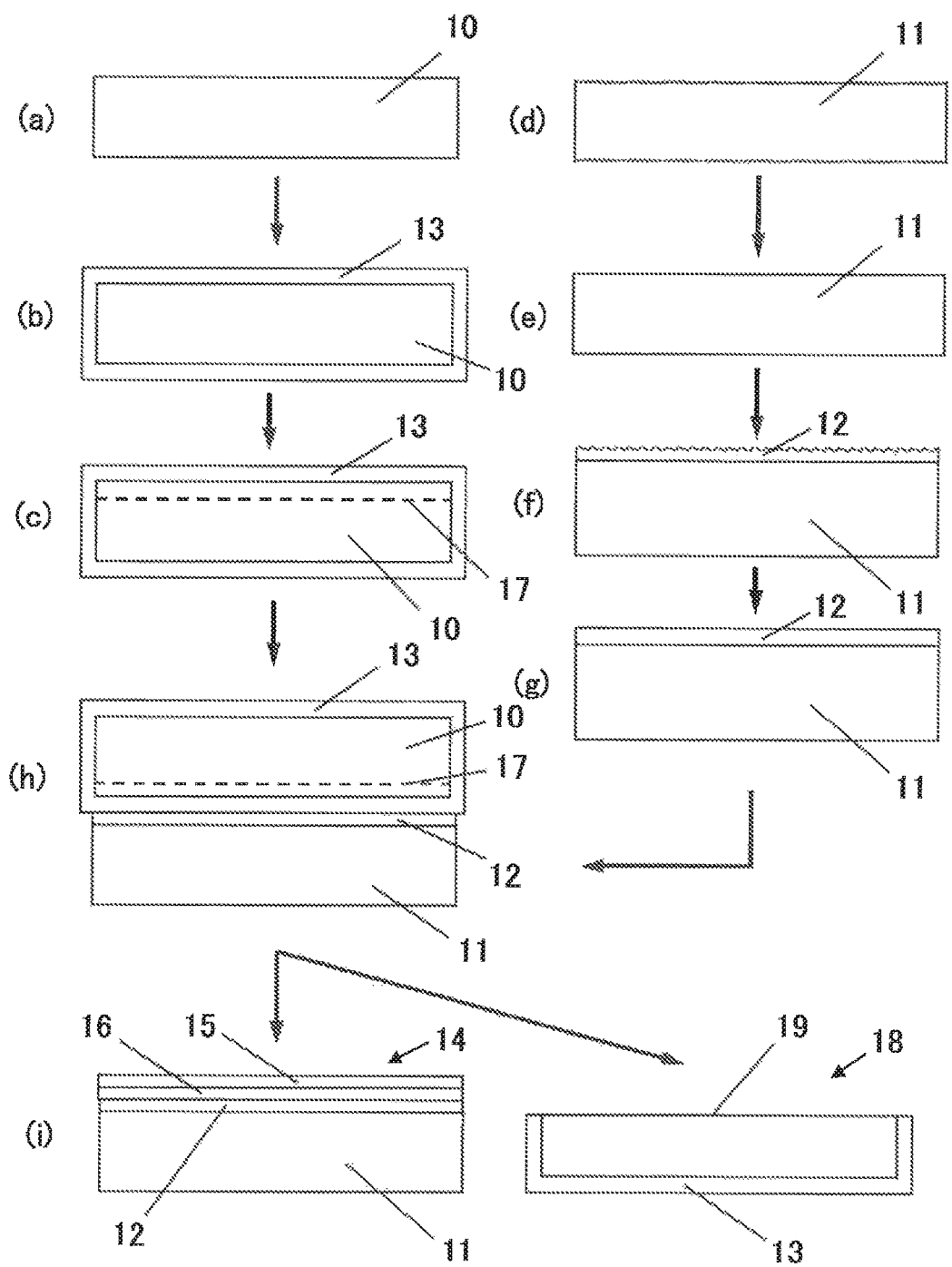
FIG. 2 is a sectional process view showing an example of an embodiment of the inventive method for manufacturing a bonded SOI wafer.

Specifically, the base wafer 11 having a chemically etched surface is prepared, for example, by slicing a silicon single crystal ingot, followed by performing lapping, laser mark printing, and chemical etching of the slice (see FIG. 2 (d)).

Then, the chemically etched surface of the base wafer is subjected to primary polishing (see Step S12 in FIG. 1).

Specifically, at least one of the chemically etched surface of the base wafer 11 (in FIG. 2, at least the upper surface of the base wafer 11) is subjected to primary polishing, together with mirror surface edge polishing, for example (see FIG. 2 (e)). In this state, the surface of the base wafer 11 has surface roughness of about 0.3 nm in an RMS value of AFM measurement (1 µm square).

Subsequently, a polycrystalline silicon layer is deposited on the surface of the base wafer subjected to the primary polishing (see Step S13 in FIG. 1).

Specifically, the polycrystalline silicon layer 12 is deposited on the surface of the base wafer 11 subjected to the primary polishing (the upper surface of the base wafer 11 in FIG. 2 (e)), for example (see FIG. 2 (f)). The polycrystalline silicon layer 12 is generally formed with a CVD apparatus. One form of the CVD apparatus includes epi-reactor, which aims to laminate a single crystalline silicon layer. With this apparatus, it is also possible to laminate a polycrystalline silicon instead of a single crystal silicon by selecting conditions such as lowering the deposition temperature. The surface after laminating the polycrystalline silicon layer has surface roughness of about 15 nm in an RMS value of AFM measurement (1 µm square).

Then, the surface of the polycrystalline silicon layer on the base wafer is subjected to secondary polishing or secondary and finish polishing (see Step S14 in FIG. 1).

Specifically, the surface of the polycrystalline silicon layer 12 on the base wafer 11 is subjected to secondary polishing with a stock removal of about 0.5 to 1 µm, followed by finish polishing with a stock removal smaller than that of the secondary polishing in accordance with needs, for example, to give surface roughness of about 0.15 nm in an RMS value of AFM measurement (1 µm square) (see FIG. 2 (g)).

The surface roughness of 0.20 nm or less in an RMS value of AFM measurement (1 µm square) can be obtained by secondary polishing alone. In this state of surface roughness, bonding failure can be reduced in bonding with a bond wafer. However, the bonding failure can be further reduced by performing finish polishing after the secondary polishing to improve the surface roughness.

On the other hand, the insulator film is formed on the bonding surface of the bond wafer (see Step S15 in FIG. 1).

Specifically, a silicon single crystal wafer is prepared as the bond wafer 10 (see FIG. 2 (a)) and subjected to oxide film growth (e.g., thermal oxidation treatment) to grow the oxide film (insulator film) 13 (see FIG. 2 (b)) to be the buried oxide film layer (BOX layer, insulator film) 16 (see FIG. 2 (i)), for example.

In addition, the ion implanted layer 17 can be formed by implanting hydrogen ions or rare gas ions above the oxide film 13 with an ion implanter (see FIG. 2 (c)). At this stage, the acceleration voltage of the ion implantation is selected so as to obtain the targeted thickness of a delamination silicon layer (i.e., the SOI layer 15 (see FIG. 2 (i))).

Then, the polished surface of the polycrystalline silicon layer of the base wafer and the bond wafer are bonded via the insulator film (see Step S16 in FIG. 1).

Specifically, the bond wafer 10 in which the ion implanted layer 17 has been formed and the base wafer 11 on which the polycrystalline silicon layer 12 has been formed are adhered to be bonded in such a way that the implanted surface of the bond wafer 10 is in contact with the surface on which the polycrystalline silicon layer 12 has been formed of the base wafer 11, for example (see FIG. 2 (h)).

Subsequently, the bonded bond wafer is thinned to form an SOI layer (see Step S17 in FIG. 1).

Specifically, the wafer being bonded is subjected to a heat treatment to generate a micro bubble layer in the ion implanted layer 17 (a delamination heat treatment), and is delaminated along the generated micro bubble layer to manufacture the bonded wafer 14 in which the buried oxide film layer 16 and the SOI layer 15 are formed on the base wafer 11 (see FIG. 2 (i)). It is to be noted that the delaminated wafer 18 having the delaminating plane 19 is derived at this stage.

As described above, the polishing process in manufacturing a bonded SOI wafer can be a process having minimum necessary polishing steps to give a flat polycrystalline silicon surface that can suppress generation of voids when the bonding is completed, after polishing the polycrystalline silicon surface by performing primary polishing of the chemically etched surface, followed by depositing the polycrystalline silicon layer on the surface subjected to the primary polishing without performing secondary polishing and finish polishing in a step of depositing a polycrystalline silicon layer, and by performing secondary polishing or secondary and finish polishing of the polycrystalline silicon layer surface without performing primary polishing in a polishing step of the polycrystalline silicon layer surface; and is highly effective thereby.

As the base wafer 11, it is preferable to use a base wafer having a resistivity of 100 Ω·cm or more.

By using such a base wafer, it is possible to manufacture an SOI wafer that is suitable as a substrate for a radio-frequency device.

In the foregoing process, it is needless to say that either of Steps S11 to S14 and Step S15 in FIG. 1, either of Steps (a) to (c) and Steps (d) to (g) in FIG. 2 can be performed first, and can be performed at the same time.

The primary polishing is preferably performed by double-side polishing.

As the primary polishing of a base wafer before growing a polycrystalline silicon layer, double-side polishing can be suitably used.

It is to be noted that the surface roughness on the polycrystalline silicon surface cannot be sufficiently reduced by a process flow in which primary polishing and secondary polishing are previously performed on the base wafer surface before laminating a polycrystalline silicon layer, and only finish polishing is performed on the surface after laminating a polycrystalline silicon layer thereon. Accordingly, such a process flow is inevitable to increase bonding failure due to voids generated on the bonding plane.

EXAMPLES

Hereinafter, the present invention will be more specifically described by showing Example and Comparative Examples, but the present invention is not limited thereto.

Example

As a bond wafer, a CZ silicon single crystal wafer (PW: mirror polished wafer) having a diameter of 300 mm, p type, 10 Ω·cm, and crystal orientation of <100> without COP (Crystal Oriented Particle) was prepared. This was subjected to growing of a 200 nm oxide film by thermal oxidation, followed by $H^+$ ion implantation of $6 \times 10^{16}$ atoms/cm$^2$ at an acceleration energy of 70 keV with an ion implanter.

As a base wafer, a CW wafer was prepared by slicing a CZ silicon single crystal with an oxygen concentration of 9.6 ppma (ASTM '79) and resistivity of 5200 Ω·cm, and being subjected to lapping, outer periphery grinding, a step of backside laser mark impressing, and chemical etching. This was subjected to primary polishing with a double-side polishing apparatus and mirror edge polishing of the periphery. At this stage, the surface roughness of the wafer surface was about 0.3 nm in an RMS value of AFM measurement (1 μm square). To this wafer, a polycrystalline silicon layer was laminated with a thickness of 2.5 μm on the surface subjected to primary polishing at the temperature of 900° C. in a reaction furnace for epitaxial growth. Subsequently, the polycrystalline silicon layer surface was subjected to secondary polishing and finish polishing (the both are single-side polishing) with a stock removal of 0.5 μm to obtain a polished wafer in which 2 μm of the polycrystalline silicon layer was laminated on the base wafer, having a surface roughness of about 0.15 nm in an RMS value of AFM measurement (1 μm square).

The bond wafer described above was bonded to a high resistance wafer having a polycrystalline silicon layer on the surface (a base wafer). This was subjected to heat treatment to generate delamination along the hydrogen ion implanted layer of the bond wafer. Then, this was subjected to an RTA treatment at 1150° C. for 30 seconds in hydrogen atmosphere (flattening heat treatment), followed by oxidation heat treatment and HF cleaning to obtain an SOI wafer with the SOI layer thickness of 150 nm provided with a polycrystalline silicon layer.

The bonded SOI wafer of Example generated zero void with a diameter of 1 mm or more that is caused by failure in transferring the SOI layer to the base wafer after the delamination step for delaminating along the hydrogen ion implanted layer.

In the manufacturing process of Example, the wafer polishing process included primary polishing before laminating the polycrystalline silicon layer, together with secondary polishing and finish polishing after laminating the polycrystalline silicon layer. Assuming that the productivity was 1 when a series of "secondary polishing and finish polishing" were performed in one time, the productivity of polishing process of the bonded SOI wafer in Example was 1.

Comparative Example 1

A bonded SOI wafer was manufactured by the same way as in Example. Provided that the base wafer used therein was prepared by performing primary polishing with a double-side polishing apparatus and mirror edge polishing of the periphery, followed by secondary polishing and finish polishing on a CW wafer produced by being sliced from a CZ silicon single crystal, and subjected to lapping, outer periphery grinding, a step of backside laser mark impressing, and chemical etching. At this stage, the surface roughness of the wafer surface was about 0.1 nm in an RMS value of AFM measurement (1 μm square). In Comparative Example 1, secondary polishing and final polishing were performed after laminating the polycrystalline silicon layer as in Example to obtain surface roughness of about 0.15 nm after the polishing.

The bonded SOI wafer of Comparative Example 1 generated zero void with a diameter of 1 mm or more that is caused by failure in transferring the SOI layer to the base wafer after the delamination step for delaminating along the hydrogen ion implanted layer.

In the manufacturing process of Comparative Example 1, however, the wafer polishing process included primary polishing, secondary polishing, and finish polishing before laminating the polycrystalline silicon layer, together with secondary polishing and finish polishing after laminating the polycrystalline silicon layer. Assuming that the productivity was 1 when a series of "secondary polishing and finish polishing" were performed in one time, the productivity of polishing process of the bonded SOI wafer in Comparative Example 1 was 0.5.

Comparative Example 2

A bonded SOI wafer was manufactured by the same way as in Example. Provided that the base wafer used therein was a CW wafer produced by being sliced from a CZ silicon single crystal, and subjected to lapping, outer periphery grinding, a step of backside laser mark impressing, and chemical etching without performing primary polishing. At this stage, the surface roughness of the wafer surface was about 10 nm in an RMS value of AFM measurement (1 μm square). In Comparative Example 2, the surface roughness was about 0.25 nm in an RMS value of AFM measurement (1 μm square) after polishing subsequent to the lamination of the polycrystalline silicon layer.

Comparative Example 2 brought the polycrystalline silicon layer to have large surface roughness after polishing, which caused insufficient bonding to generate large amount of voids with diameters of 1 mm or more that are caused by failure in transferring the SOI layer to the base wafer after the delamination step for delaminating along the hydrogen ion implanted layer.

In Comparative Example 2, a large amount of voids were generated on the plane in the delamination step described above, and the manufacturing of a bonded SOI wafer was stopped. Accordingly, the productivity of the polishing process was not evaluated.

Table 1 shows the processes and results in Example, Comparative Example 1, and Comparative Example 2 described above.

TABLE 1

|  | Polishing of base wafer | Surface roughness after polishing base wafer | Polishing of polycrystalline silicon layer | Surface roughness after polishing polycrystalline silicon layer | Voids with diameter of 1 mm or more | Productivity of polishing process* |
|---|---|---|---|---|---|---|
| Example | Primary polishing | ca. 0.3 nm | secondary polishing + finish polishing | ca. 0.15 nm | Not generated | 1 |
| Comparative Example 1 | Primary polishing + secondary polishing + finish polishing | ca. 0.1 nm | secondary polishing + finish polishing | ca. 0.15 nm | Not generated | 0.5 |
| Comparative Example 2 | — | ca. 10 nm (not polished) | secondary polishing + finish polishing | ca. 0.25 nm | Generated in large amount | — |

*Productivity in case of assuming that the productivity was 1 when "secondary polishing + finish polishing" were performed in one time As can be seen from Table 1, Example performed primary polishing alone in the polishing process of the base wafer to obtain surface roughness after polishing the polycrystalline silicon layer being equal to that of Comparative Example 1, in which primary polishing, secondary polishing, and finish polishing were performed in the polishing process of the base wafer. This brought the polishing process to have higher productivity compared to Comparative Example 1 without generating a void with a diameter of 1 mm or more after the delamination process as in Comparative Example 1. Comparative Example 2, in which polishing of the base wafer was not performed, gave surface roughness larger than that of Example and Comparative Example 1 after polishing the polycrystalline silicon layer. This caused insufficient bonding to generate a large amount of voids with diameters of 1 mm or more on the plane after the delamination process, which obliged to stop the manufacturing of the bonded SOI wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer by bonding a bond wafer and a base wafer, each composed of a silicon single crystal, via an insulator film, comprising the steps of:
    depositing a polycrystalline silicon layer on the bonding surface side of the base wafer,
    polishing a surface of the polycrystalline silicon layer,
    forming the insulator film on the bonding surface of the bond wafer,
    bonding the polished surface of the polycrystalline silicon layer of the base wafer and the bond wafer via the insulator film, and
    thinning the bonded bond wafer to form an SOI layer; wherein,
    in the step of depositing the polycrystalline silicon layer, a wafer having a chemically etched surface is used as the base wafer, and the chemically etched surface is subjected to primary polishing, without performing secondary polishing and finish polishing, followed by depositing the polycrystalline silicon layer on the surface subjected to the primary polishing without performing secondary polishing and finish polishing, and
    in the step of polishing the surface of the polycrystalline silicon layer, the surface of the polycrystalline silicon layer is subjected to secondary polishing or secondary and finish polishing without performing primary polishing.

2. The method for manufacturing a bonded SOI wafer according to claim 1, wherein a base wafer having a resistivity of 100 Ω·cm or more is used as the base wafer.

3. The method for manufacturing a bonded SOI wafer according to claim 2, wherein the primary polishing is performed by double-side polishing.

4. The method for manufacturing a bonded SOI wafer according to claim 1, wherein the primary polishing is performed by double-side polishing.

* * * * *